United States Patent [19]
Anderson

[11] Patent Number: 6,064,313
[45] Date of Patent: May 16, 2000

[54] ALTERNATING CURRENT CIRCUIT AND OUTLET TESTER

[76] Inventor: William J. Anderson, 1335 Pine St., Glenview, Ill. 60025

[21] Appl. No.: 09/061,606

[22] Filed: Apr. 16, 1998

Related U.S. Application Data

[60] Provisional application No. 60/044,726, Apr. 21, 1997.

[51] Int. Cl.$^7$ ................................................. G08B 21/00
[52] U.S. Cl. ...................... 340/660; 340/661; 340/662; 340/664; 324/508; 324/509
[58] Field of Search ..................................... 340/660, 661, 340/662, 663, 664; 324/508, 509

[56] References Cited

U.S. PATENT DOCUMENTS

| | | | |
|---|---|---|---|
| 4,857,826 | 8/1989 | Graham | 324/508 |
| 4,862,142 | 8/1989 | Knight | 340/522 |
| 4,879,625 | 11/1989 | Potenzone | 361/90 |
| 5,525,908 | 6/1996 | Brownell | 324/508 |

*Primary Examiner*—Daniel J. Wu

[57] ABSTRACT

A tester for checking the impedance of an electrical circuit by measuring the percentage voltage drop of the circuit resulting from the application of a user-supplied load. The tester includes connection means suitable for connection into the electrical circuit to be tested. The tester stores a sample of the voltage present at the connection. As the user applies a load to the circuit, the tester compares the sampled circuit voltage to the loaded circuit voltage. If the voltage difference after a set delay time is greater than a set percentage, an indicator on the tester alerts the user to this fact. A large voltage drop in a circuit can be an indication of hazardous wiring conditions, possibly due to corroded or loose connections, improper wire size, or other faulty components in the circuit.

6 Claims, 4 Drawing Sheets

ALTERNATING CURRENT CIRCUIT AND OUTLET TESTER

This application claims benefit of Provisional Appln 60/044,726 filed Apr. 21, 1997.

FIELD OF THE INVENTION

The present invention generally relates to electrical distribution circuit testers, and more particularly to testers for electrical circuits which can measure percentage voltage drop of the circuit under load, thereby providing some measure of the circuit's ability to safely supply that load with power.

BACKGROUND OF THE INVENTION

Electrical distribution systems can have or develop high resistance in wiring, connections, or components. Wiring can be sized improperly. Splices from wire to wire can be installed improperly. Connections between wires and wiring devices (outlets, connectors, circuit breakers, fuses, sockets, etc.) can become loose through vibration, improper installation, or time. Connections can also corrode due to the effects of the environment on the connection, or from electrolytic corrosion due to the improper selection and combination of aluminum and copper components. Two negative effects result from this high resistance.

One negative effect is resistive heating that can occur at higher load currents in the circuit. If the source of high resistance gets hot enough to ignite nearby combustible items, a fire can result. The National Fire Protection Association (NFPA) compiles data on fires and their causes. Recent statistics from the NFPA show that electrical distribution equipment is the fifth leading cause of home fires, the fourth in fire deaths, and the third leading cause of direct property damage in home fires.

The second negative effect is the voltage drop that can occur in a circuit downstream of the high resistance. Voltage drops are especially troublesome for computers, which can lose data during even momentary dips in supply voltage.

Inexpensive alternating current circuit and outlet testers are available in a number of configurations. Some test for connection of hot, neutral, and ground leads to the correct outlet terminals. Others test for capability of a ground fault circuit interrupter (GFCI) to operate properly. Still others test the capability of the ground conductor to carry current. Some have combinations of the above mentioned capabilities, but no tester retailing at a price attractive to consumers includes any provision for testing the capability of the circuit or outlet to carry a load. There is a device (U.S. Pat. No. 4,857,826) sold to professional electricians that can test the load-carrying ability of an outlet, but the device includes many other tests as well, and sells for more than four hundred dollars.

Accordingly, the primary object of this invention is to provide a tester which can detect percentage voltage drop in electrical circuits and outlets due to an applied load, is simple both to use and to manufacture, and yet can be marketed at a price that is attractive to consumers.

SUMMARY OF THE INVENTION

The present invention provides a tester incorporating the improvements listed above. The tester is inexpensive, and easy to use. A sample of the circuit voltage is taken and stored within the tester. The user connects a load to the circuit under test. The tester continuously compares the circuit voltage to the stored sample. If the circuit voltage drops below a set percentage of the sample, an indicator notifies the user of this fact. If the voltage drop continues for a set period of time (which allows for high startup currents of motors and such), the user is also notified, this last notification continuing until power is removed from the tester.

The foregoing features and advantages of the present invention will be apparent from the following more particular description of the invention. The accompanying drawings, listed hereinbelow, are useful in explaining the invention.

BRIEF DESCRIPTION OF THE DRAWINGS

FIG. 2b is a schematic diagram of the internals of the integrated circuit used in FIG. 2a.

DETAILED DESCRIPTION

Figure 1:
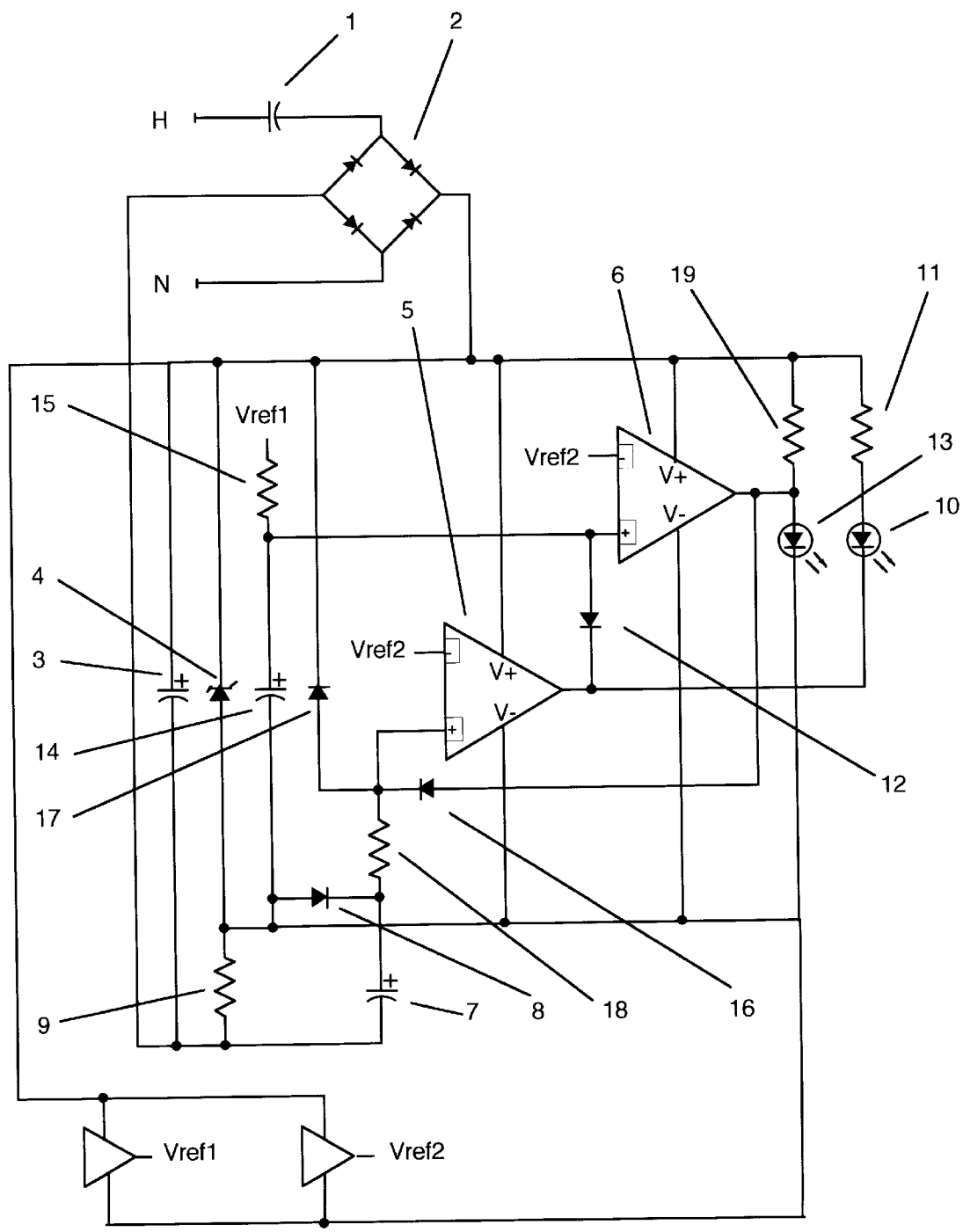
FIG. 1 is a schematic drawing of an electrical outlet tester according to the invention.

An electrical circuit tester is schematically illustrated in FIG. 1

AC voltage from the outlet or circuit under test is applied to the tester through terminals H and N. This voltage is rectified by diode bridge 2. The rectified voltage is filtered by capacitor 3 to provide a DC voltage proportional to the AC voltage input to the tester. Zener diode 4 assures that the portion of the DC voltage used as the comparator power supply stays constant and within the maximum specifications for power supply voltage for comparators 5 and 6. Capacitor 1 functions as a series impedance to limit the current through zener diode 4 and the rest of the tester circuit. Capacitor 7 initially charges through diode 8 to the voltage across resistor 9, this voltage being applied also to the non-inverting input of comparator 5. through resistor 18. Since zener diode 4 keeps the voltage drop across the tester circuit constant, the voltage drop across resistor 9 changes solely due to changes in the AC voltage input to the tester. A positive reference voltage Vref2 is applied to the inverting input of both comparators 5 and 6. Comparator 5's output will initially be low since the non-inverting input will be one diode drop below the comparator's V-supply input, and the inverting input will be at the positive reference voltage Vref2. Comparator 5's output being low initially will cause light emitting diode (LED) 10 to become illuminated, indicating to the user that power is on in the circuit being tested. Current through LED 10 is limited to within its maximum specifications by resistor 11. The non-inverting input of comparator 6 is held low through diode 12's connection to the output of comparator 5. Since the inverting input of comparator 6 is at the positive reference voltage Vref2, the output of comparator 6 will initially be low, causing LED 13 to be off. LED 13's current is limited to within maximum specifications by resistor 19.

The user applies a load to the circuit under test. If the AC voltage input to the tester drops as the load is applied, the voltage across resistor 9 will drop proportionately to the AC input voltage to the tester. Capacitor 7 will remain charged to its initial sample voltage, diode 8 being reverse-biased since the voltage across resistor 9 is now less than the voltage across capacitor 7. If the voltage drop is great enough (the set percentage voltage drop), the voltage across capacitor 7 (through resistor 18) to the non-inverting input of comparator 5 will be greater than the voltage across the combination of resistor 9 and the positive reference voltage Vref2 at Comparator 5's inverting input, thus causing the output of comparator 5 to go high. This high output causes LED 10 to go off, and also reverse biases diode 12, allowing capacitor 14 to charge through resistor 15 from the positive reference voltage Vref1. If the AC voltage input to the tester continues at the lower voltage for the duration of the set time delay represented by capacitor 14 and resistor 15, the non-inverting input of comparator 6 will become higher than the inverting input, forcing comparator 6 output high. This causes LED 13 to illuminate, indicating to the user that the AC input voltage to the tester has dropped below the set percentage voltage drop for the set time delay. Diode 16 connects the high output of Comparator 6 to the input of Comparator 5, thus latching the circuit with LED 13 on until the power is removed from the tester.

The values of capacitor 1, resistor 9, and Vref2 can be adjusted to accommodate various AC line voltages and voltage drop percentage trigger points. Capacitor 14 and resistor 15 can be adjusted to accommodate various desired time delays before illumination of LED 13. Capacitor 7 and resistor 18 can be varied to change the time constant for following gradual swings in the AC input voltage to the tester. Diode 17 provides a discharge path for capacitor 7 to reset the tester when power is removed.

Figure 2A:
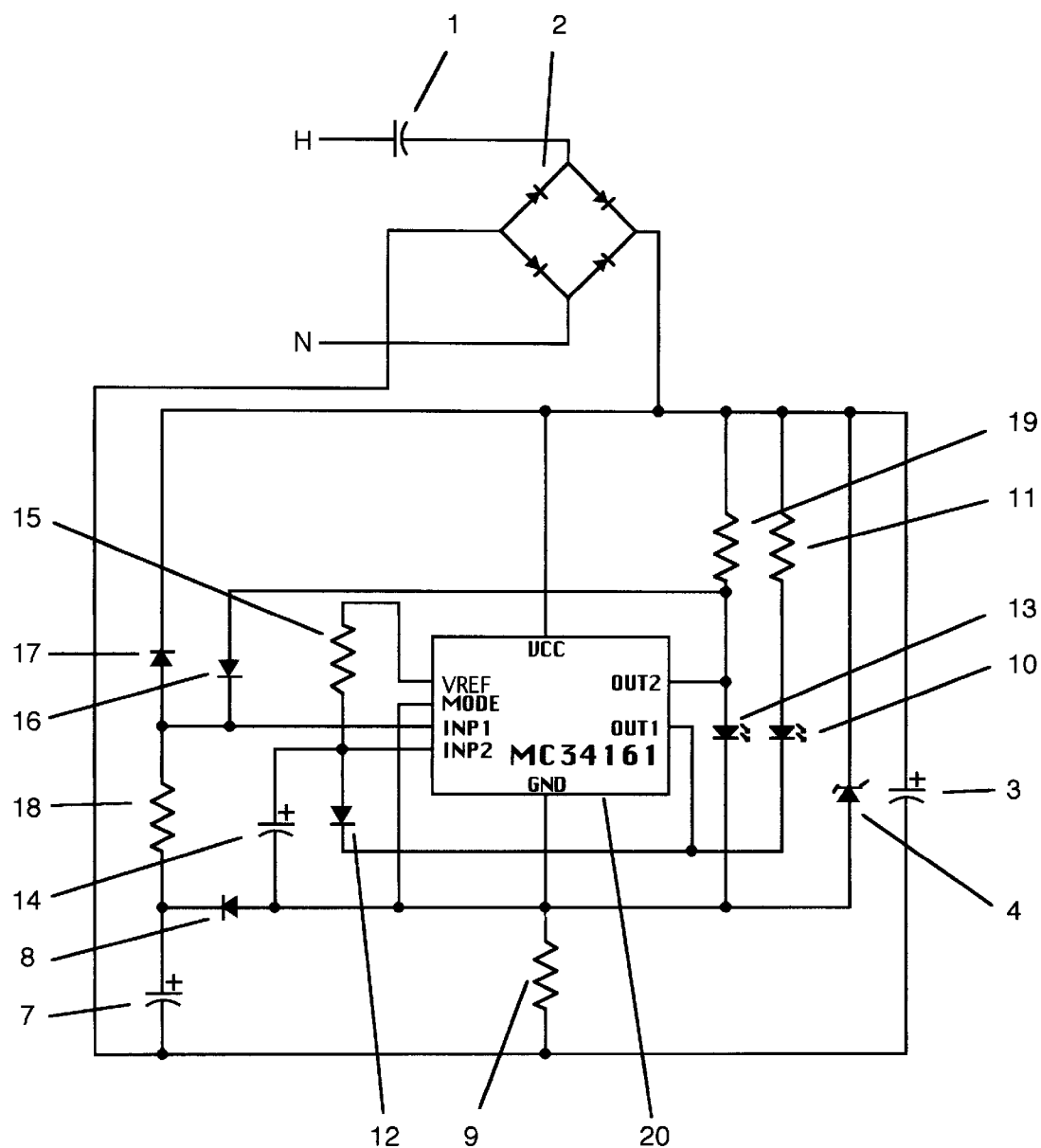
FIG. 2a is a schematic drawing of a preferred embodiment of the invention.
Figure 2B:
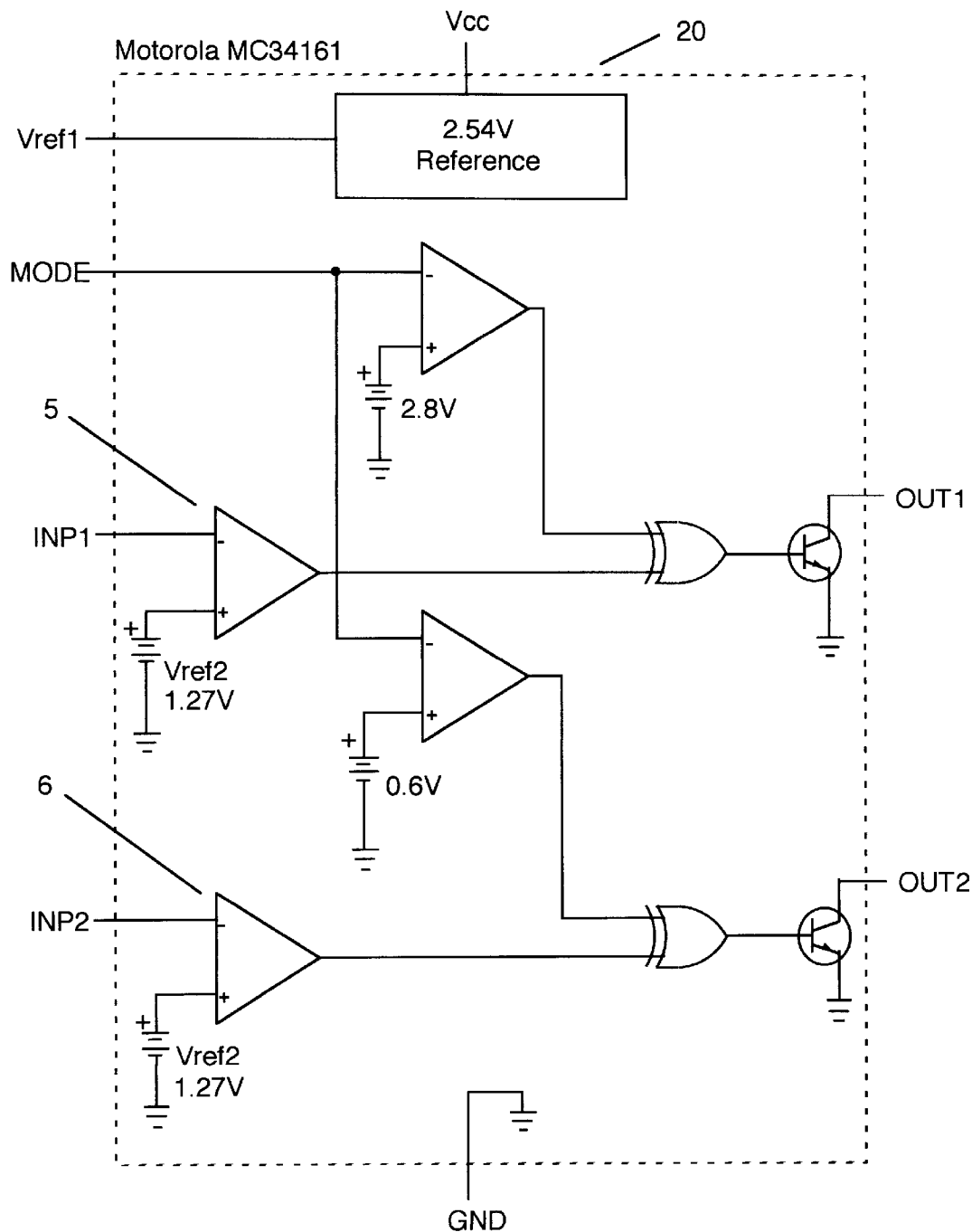

An alternative embodiment is illustrated in FIGS. 2a and 2b. In this embodiment, comparators 5 and 6, and the positive reference generators Vref1 and Vref2 are all contained in integrated circuit 20. This embodiment works as follows:

AC voltage from the outlet or circuit under test is applied to the tester through terminals H and N. This voltage is rectified by diode bridge 2. The rectified voltage is filtered by capacitor 3 to provide a DC voltage proportional to the AC voltage input to the tester. Zener diode 4 assures that the portion of the DC voltage used as the power supply for integrated circuit 20 stays within the maximum specifications for integrated circuit 20. Capacitor 1 functions as a series impedance to limit the current through zener diode 4 and the rest of the tester circuit. Capacitor 7 initially charges through diode 8 to the voltage across resistor 9, this voltage being applied also to INP1 (the non-inverting comparator 5 input) of integrated circuit 20 through resistor 18. Since zener diode 4 keeps the voltage drop across the tester circuit constant, the voltage drop across resistor 9 changes solely due to changes in the AC voltage input to the tester. A positive reference voltage Vref2 is internally applied to the inverting inputs of both comparators 5 and 6 in integrated circuit 20. OUT1 of integrated circuit 20 will initially be low since INP1 will be one diode drop below the comparator 5's GND supply input, and the internal inverting input of integrated circuit 20 will be at the positive reference voltage Vref2. OUT1 being low initially will cause LED 10 to become illuminated, indicating to the user that power is on in the circuit being tested. Current through LED 10 is limited to within its maximum specifications by resistor 11. INP2 is held low through diode 12's connection to OUT1. Since the internal inverting input of comparator 6 is at the positive reference voltage Vref2, OUT2 will initially be low, causing LED 13 to be off. LED 13's current is limited to within maximum specifications by resistor 19.

The user adds a load to the circuit. If the AC voltage input to the tester drops as the load is applied, the voltage across resistor 9 will drop proportionately to the AC voltage input to the tester. Capacitor 7 will remain charged to its initial voltage, diode 8 being reverse-biased since the voltage across resistor 9 is now less than the voltage across capacitor 7. If the voltage drop is great enough (the set percentage voltage drop), the voltage across capacitor 7 to INP1 (through resistor 18) will be greater than the voltage across the combination of resistor 9 and the positive reference voltage Vref2 connected to comparator 5's inverting input, thus causing OUT1 to go high. This high output causes LED 10 to go off, and also reverse biases diode 12, allowing capacitor 14 to charge through resistor 15 from positive reference voltage Vref1. If the AC voltage input to the tester continues at the lower voltage for the duration of the set time delay represented by capacitor 14 and resistor 15, INP2 will become higher than the internal inverting input of comparator 6, forcing OUT2 high. This causes LED 13 to illuminate, indicating to the user that the AC input voltage to the tester has dropped below the set percentage voltage drop for the set delay time. Diode 16 connects OUT2 to INP1, thus latching the circuit with LED 13 on until the power is removed from the tester.

The values of capacitor 1 and resistor 9 can be adjusted to accommodate various AC line voltages and voltage drop percentage trigger points. Capacitor 14 and resistor 15 can be adjusted to accommodate various desired delays before illumination of LED 13. Capacitor 7 and resistor 18 can be varied to change the time constant for following gradual swings in the AC input voltage to the tester. Diode 17 provides a discharge path for capacitor 7 to reset the tester when power is removed.

Figure 3:
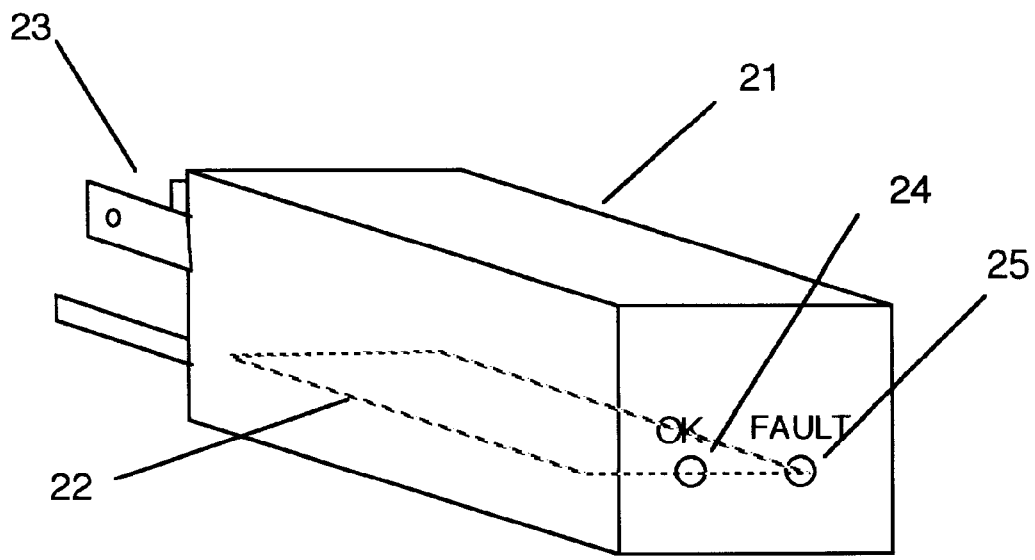
FIG. 3 is a drawing of the physical packaging of an embodiment of the invention.

FIG. 3 shows a representative embodiment for packaging a tester like that described in FIG. 2a. Case 21 provides a housing for the tester components. Printed circuit board 22 contains all the electronic components. Plug 23 provides connection between a standard electrical outlet and the tester electronics. LEDs 10 and 13 are viewable through housing holes 24 and 25 respectively.

Another embodiment replaces diode bridge 2 with a single diode 2 (for protection against reverse polarity connection), and replaces capacitor 1 with a resistor 1. By adjusting the ratio of resistor 1 and resistor 9, the tester can be used to test circuits and outlets distributing DC voltage.

While the invention has been particularly shown and described with reference to a particular embodiment thereof, it will be understood by those skilled in the art that various changes in form and detail may be made therein without departing from the spirit and scope of the invention.

I claim:

1. A tester for checking the impedance of electrical circuits by measuring the voltage drop resulting from a user-supplied load to the circuit, said tester comprising:

a) connection means to said electrical circuit;

b) sampling means for storing a sample of the electrical circuit voltage without the application of said user-supplied load, said sampling means operating continuously without the need for triggering by the user;

c) comparison means for continuously comparing said sample with instantaneous changes in said electrical circuit voltage resulting from operation of said user-supplied load on said circuit;

d) first indicator means for notifying said user when said comparison result indicates that said electrical circuit voltage is less than said sample by more than a set percentage;

e) timer means activated under the same conditions as said first indicator means, said timer means becoming deactivated when said electrical circuit voltage rises to the point where said conditions are no longer met;

f) second indicator means becoming activated when said timer has been continuously activated for a set minimum time;

g) latching means for said second indicator, said latching means keeping said second indicator in the activated condition once it has been activated, said latch becoming unlatched when power is removed from said tester for a set period of time.

2. A tester for checking the impedance of direct current electrical distribution circuits by measuring the voltage drop resulting from a user-supplied load to the circuit, said tester comprising:

a) connection means to said electrical circuit;
   b) rectification means in series with said electrical circuit connection means providing proper operation of said tester with said electrical circuit connection being made in normal or reverse polarity to said direct current electrical distribution circuit;
   c) sampling means for storing a sample of the electrical circuit voltage without the application of said user-supplied load, said sampling means operating continuously without the need for triggering by the user;
   d) comparison means for continuously comparing said sample with instantaneous changes in said electrical circuit voltage resulting from operation of said user-supplied load on said circuit;
   e) first indicator means for notifying said user when said comparison result indicates that said electrical circuit voltage is less than said sample by more than a set percentage;
   f) timer means activated under the same conditions as said first indicator means, said timer means becoming deactivated when said electrical circuit voltage rises to the point where said conditions are no longer met;
   g) second indicator means becoming activated when said timer has been continuously activated for a set minimum time;
   h) latching means for said second indicator, said latching means keeping said second indicator in the activated condition once it has been activated, said latching means becoming unlatched when power is removed from said tester for a set period of time.

3. A tester for checking the impedance of electrical circuits by measuring the voltage drop resulting from a user-supplied load to the circuit, said tester comprising:

a) connection means to said electrical circuit;
   b) sampling means for storing a sample of the electrical circuit voltage without the application of said user-supplied load, said sampling means operating continuously without the need for triggering by the user;
   c) comparison means for continuously comparing said sample with instantaneous changes in said electrical circuit voltage resulting from operation of said user-supplied load on said circuit;
   d) indicator means for notifying said user when said comparison result indicates that said electrical circuit voltage is less than said sample by more than a set percentage.

4. A tester as in claim 3, said tester providing second connection means to said user-supplied load as well as said first connection means to said electrical circuit, said second connection means mitigating the need for two connections to said electrical circuit—one for said tester and one for said user-supplied load.

5. A tester as in claim 3, said sampling means having a discharge means allowing continuous tracking of slow changes in said electrical circuit voltage without triggering said comparison means.

6. A tester as in claim 3, said user-supplied load being connected to said circuit at a point other than that at which said tester is connected, thus providing for detection of faults in wiring or connections which are between said tester and the supply source for said electrical circuit.

\* \* \* \* \*